United States Patent
Choi et al.

(10) Patent No.: US 11,963,383 B2
(45) Date of Patent: Apr. 16, 2024

(54) OLED PANEL LOWER PART PROTECTION FILM, AND ORGANIC LIGHT-EMITTING DISPLAY APPARATUS COMPRISING SAME

(71) Applicant: Samsung Display Co., Ltd., Yongin-si (KR)

(72) Inventors: Youngseo Choi, Yongin-si (KR); Sangshin Kim, Anyang-si (KR); Jinhyuk Kim, Anyang-si (KR); Youngdon Park, Anyang-si (KR); Youngbin Baek, Anyang-si (KR); Sangwoo Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 222 days.

(21) Appl. No.: 17/408,351

(22) Filed: Aug. 20, 2021

(65) Prior Publication Data

US 2021/0384469 A1 Dec. 9, 2021

Related U.S. Application Data

(62) Division of application No. 16/478,838, filed as application No. PCT/KR2018/000822 on Jan. 18, 2018, now Pat. No. 11,108,018.

(30) Foreign Application Priority Data

Jan. 18, 2017 (KR) .................. 10-2017-0008519

(51) Int. Cl.
*H01L 51/00* (2006.01)
*B32B 7/06* (2019.01)
(Continued)

(52) U.S. Cl.
CPC ............ *H10K 50/844* (2023.02); *B32B 7/06* (2013.01); *B32B 7/12* (2013.01); *B32B 27/08* (2013.01);
(Continued)

(58) Field of Classification Search
CPC .... H01L 51/52; H01L 51/5253; H01L 51/004
See application file for complete search history.

(56) References Cited

U.S. PATENT DOCUMENTS 8,957,156 B2 * 2/2015 Kim .................... C08G 18/718
522/90
9,891,738 B2 2/2018 Huppi et al.
(Continued)

FOREIGN PATENT DOCUMENTS

| CN | 101155890 A | 4/2008 |
| CN | 103429427 A | 12/2013 |

(Continued)

*Primary Examiner* — Dale E Page
*Assistant Examiner* — Wilner Jean Baptiste
(74) *Attorney, Agent, or Firm* — Lewis Roca Rothgerber Christie LLP

(57) ABSTRACT

A lower part protection film for an OLED panel is provided. More particularly, a lower part protection film for an OLED panel, having a significantly improved recognition rate of an alignment process, being capable of preventing generation of static electricity through an antistatic treatment, and having excellent adhesion to an OLED panel at the same time, and an organic light-emitting display apparatus including the lower part protection film for an OLED panel are provided.

10 Claims, 3 Drawing Sheets

(51) Int. Cl.
*B32B 7/12* (2006.01)
*B32B 27/08* (2006.01)
*B32B 27/36* (2006.01)
*B32B 37/02* (2006.01)
*B32B 37/12* (2006.01)
*B32B 37/18* (2006.01)
*B32B 38/10* (2006.01)
*C09J 5/02* (2006.01)
*C09J 7/25* (2018.01)
*C09J 7/30* (2018.01)
*C09J 9/02* (2006.01)
*C09J 11/06* (2006.01)
*H10K 50/844* (2023.01)
*H10K 85/10* (2023.01)
*H10K 85/60* (2023.01)
*C08K 5/3432* (2006.01)

(52) U.S. Cl.
CPC .............. *B32B 27/36* (2013.01); *B32B 37/02* (2013.01); *B32B 37/12* (2013.01); *B32B 37/182* (2013.01); *B32B 38/10* (2013.01); *C09J 5/02* (2013.01); *C09J 7/255* (2018.01); *C09J 7/30* (2018.01); *C09J 9/02* (2013.01); *C09J 11/06* (2013.01); *H10K 85/141* (2023.02); *H10K 85/654* (2023.02); *B32B 2255/10* (2013.01); *B32B 2255/26* (2013.01); *B32B 2367/00* (2013.01); *B32B 2405/00* (2013.01); *B32B 2457/206* (2013.01); *C08K 5/3432* (2013.01); *C08K 2201/017* (2013.01); *C09J 2203/326* (2013.01); *C09J 2301/408* (2020.08); *C09J 2433/00* (2013.01); *C09J 2467/006* (2013.01)

(56) References Cited

U.S. PATENT DOCUMENTS

| | | |
|---|---|---|
| 2005/0040763 A1 | 2/2005 | Yoon et al. |
| 2009/0022967 A1 | 1/2009 | Inenaga |
| 2013/0040093 A1* | 2/2013 | Horiuchi ................. B32B 37/02 428/78 |
| 2013/0050617 A1 | 2/2013 | Lee et al. |
| 2014/0008026 A1 | 1/2014 | Eveson et al. |
| 2014/0008115 A1 | 1/2014 | Sato et al. |
| 2014/0091288 A1 | 4/2014 | Lee et al. |
| 2015/0315425 A1* | 11/2015 | Mun ..................... C08F 220/20 526/260 |
| 2016/0013445 A1 | 1/2016 | Isaji |
| 2016/0053138 A1* | 2/2016 | Lee ........................ C08K 5/23 428/447 |
| 2016/0159052 A1 | 6/2016 | Kim et al. |

FOREIGN PATENT DOCUMENTS

| | | |
|---|---|---|
| CN | 103429433 A | 12/2013 |
| CN | 106183275 A | 12/2016 |
| EP | 3037870 A2 | 6/2016 |
| KR | 10-0252953 B1 | 4/2000 |
| KR | 10-2005-0019451 A | 3/2005 |
| KR | 10-2007-0069580 A | 7/2007 |
| KR | 10-2007-0101711 A | 10/2007 |
| KR | 10-2009-0044089 A | 5/2009 |
| KR | 10-2014-0043022 A | 4/2014 |
| KR | 10-2016-0024003 A | 3/2016 |
| KR | 10-2016-0081293 A | 7/2016 |
| KR | 10-1801688 B1 | 11/2017 |
| WO | WO 2015/170872 A1 | 11/2015 |

* cited by examiner

OLED PANEL LOWER PART PROTECTION FILM, AND ORGANIC LIGHT-EMITTING DISPLAY APPARATUS COMPRISING SAME

CROSS-REFERENCE TO RELATED APPLICATION(S)

This application is a divisional of U.S. patent application Ser. No. 16/478,838, filed Jul. 17, 2019, which is a National Phase Patent Application of International Patent Application Number PCT/KR2018/000822, filed on Jan. 18, 2018, which claims priority of Korean Patent Application No. 10-2017-0008519, filed Jan. 18, 2017. The entire contents of all of which are incorporated herein by reference.

TECHNICAL FIELD

The present disclosure relates to a protection film for a lower part of an OLED panel, and more particularly, to a protection film for a lower part for an OLED panel, the protection film having a significantly improved recognition rate of an alignment process, being capable of preventing generation of static electricity through an antistatic treatment, and having excellent adhesion to an OLED panel at the same time, and an organic light-emitting display apparatus including the protection film for a lower part of an OLED panel.

BACKGROUND ART

Recently, flat panel displays have been gaining attention as display apparatuses according to the remarkable progress in information communication technology and expansion of the market. Examples of the flat panel displays include liquid crystal displays, plasma display panels, and organic light emitting devices.

Organic light emitting devices have advantages such as a high response speed, a light weight, a small thickness, a compact size, low power consumption, self-emitting characteristics, and flexible characteristics, and thus, are increasingly in demand for next-generation display devices and flexible displays, and even in illumination.

An organic light emitting device is manufactured by sequentially depositing, on a glass substrate, a transparent electrode, a hole injection layer, a hole transport layer, an organic emitting layer, an electron transport layer, an electron injection layer, and a metal electrode in an order, and emits light based on the principle that light is emitted by using energy discharged when electrons and holes supplied from both electrodes recombine in the organic emitting layer.

An organic light-emitting device is likely to deteriorate due to external factors such as external humidity or oxygen or ultraviolet rays, and thus a packaging technique of encapsulating the organic light-emitting device is essential, and for applications over a broad range, an organic light-emitting device is required to be thin.

Meanwhile, a lower part protection film is included under an OLED panel to protect the OLED panel and prevent generation of static electricity. A lower part protection film for an OLED panel according to the related art has a low reflectance, and thus, errors are frequently caused in an alignment process, making the manufacture of an OLED panel difficult. Also, generation of static electricity is not prevented, and adhesion to the OLED panel is poor.

Thus, there is the pressing need for research into a lower part protection film for an OLED panel, the lower part protection film having a high reflectance to significantly improve a recognition rate of an alignment process, being capable of preventing generation of static electricity through an antistatic treatment, and having excellent adhesion to an OLED panel at the same time.

DESCRIPTION OF EMBODIMENTS

Technical Problem

The present disclosure provides a lower part protection film for an OLED panel, the lower part protection film having a high reflectance to significantly improve a recognition rate of an alignment process, being capable of preventing generation of static electricity through an antistatic treatment, and having excellent adhesion to an OLED panel at the same time.

Solution to Problem

According to an aspect of the present disclosure, there is provided a lower part protection film for an OLED panel, the lower part protection film including: a base-carrier film including a base film including a first adhesive layer formed on an upper surface of a first base material and a carrier film including a second adhesive layer adhered to a lower surface of the first base material and a second base material adhered to a lower surface of the second adhesive layer; and a liner film adhered using the first adhesive layer, wherein the lower part protection film for an OLED panel satisfies both Condition (1) and Condition (2) below:
  (1) a reflectance of the lower part protection film for an OLED panel is 12 to 18% at a wavelength of 400 to 700 nm; and
  (2) a reflectance ratio between the liner film and the base-carrier film at a wavelength of 400 nm to 700 nm is 1:0.3 to 3.0.

Advantageous Effects of Disclosure

A lower part protection film for an OLED panel, according to the present disclosure, may have a high reflectance, and thus a recognition rate of an alignment process may be significantly improved, and generation of static electricity may be prevented through an antistatic treatment, and adhesion to an OLED panel may be excellent at the same time.

BEST MODE

Figure 1:
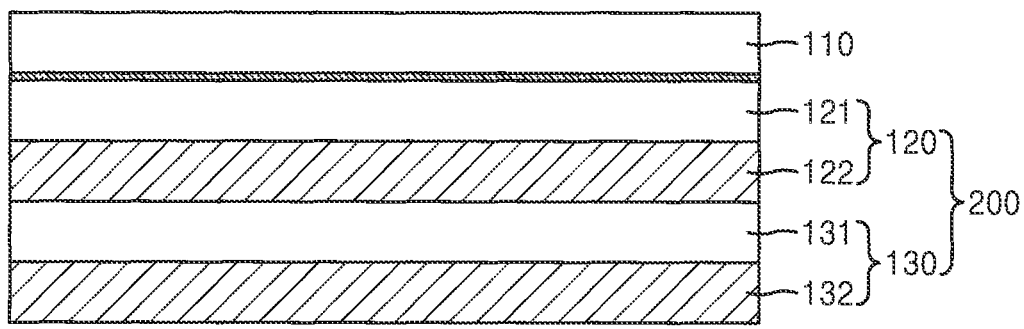
FIG. 1 is a cross-sectional view of a lower part protection film for an OLED panel, according to an embodiment of the present disclosure.

According to an embodiment of the present disclosure, a lower part protection film for an OLED panel is provided, the lower part protection film for an OLED panel, including: a base-carrier film including a base film including a first adhesive layer formed on an upper surface of a first base material and a carrier film including a second adhesive layer adhered to a lower surface of the first base material and a second base material adhered to a lower surface of the second adhesive layer; and a liner film adhered using the first adhesive layer, wherein the lower part protection film for an OLED panel satisfies both Conditions (1) and (2) below:
(1) a reflectance of the lower part protection film for an OLED panel is 12 to 18% at a wavelength of 400 to 700 nm; and
(2) a reflectance ratio between the liner film and the base-carrier film at a wavelength of 400 to 700 nm is 1:0.3 to 3.0.

According to an embodiment of the present disclosure, the lower part protection film for an OLED panel may satisfy both Conditions (1) and (2) below:
(1) a reflectance of the lower part protection film for an OLED panel is 12 to 16% at a wavelength of 400 to 700 nm; and
(2) a reflectance ratio between the liner film and the base-carrier film at a wavelength of 400 to 700 nm is 1:0.62 to 2.6.

Also, the lower part protection film for an OLED panel may satisfy Condition (3) below at a wavelength of 400 to 700 nm:

$$\frac{b+c}{a} \leq 1.0, \qquad (3)$$

where a denotes a reflectance deviation (%) of the liner film, b denotes a reflectance deviation (%) of the base-carrier film, and c denotes a reflectance deviation (%) of the lower part protection film for an OLED panel.

Also, a reflectance of the lower part protection film for an OLED panel may be gradually reduced as a wavelength increases.

Also, the first base material and the second base material may be a PET base material, and the first adhesive layer and the second adhesive layer may be acrylic adhesive layers.

Also, a lower surface of the liner film may be silicon release-treated.

Also, the liner film may satisfy both Conditions (4) and (5) below:
(4) reflectance at a wavelength of 520 nm>reflectance at a wavelength of 440 nm; and
(5) reflectance at a wavelength of 520 nm>reflectance at a wavelength of 690 nm.

Also, the liner film may have a reflectance of 5 to 13% at a wavelength of 400 to 700 nm.

Also, the base-carrier film may have a reflectance of 8 to 13% at a wavelength of 400 to 700 nm.

Also, the first adhesive layer and the second adhesive layer may include an antistatic agent, and at least one surface of each of the liner film, the first base material, and the second base material may be antistatic treated.

Also, the base film may have a transmittivity of 85 to 98% and a haze of 0.2 to 1.0%.

Also, the lower part protection film for an OLED panel may have a total haze of 5 to 10%.

Also, the first adhesive layer may have a thickness of 10 to 30 μm, and the first base material may have a thickness of 65 to 140 μm.

Also, the liner film may have a thickness of 55 to 95 μm, and the second adhesive layer may have a thickness of 1 to 10 μm, and the second base material may have a thickness of 20 to 60 μm.

Also, the liner film may have a releasing force of 5 gf/in or less.

Also, adhesion of the first adhesive layer measured by using a measurement method below may be 250 gf/in or higher:
[Measurement Method]
The first adhesive layer was adhered to glass, and after 24 hours, an adhesion of the first adhesive layer was measured when the first adhesive layer was exfoliated at 180° at a rate of 5 mm per second.

Also, an exfoliation force between the base film and the carrier film may be 3 to 10 gf/in.

According to another embodiment of the present disclosure, there is provided a method of applying a lower part protection film for an OLED panel, the method including: exfoliating a liner film from the lower part protection film for an OLED panel; attaching, to the OLED panel, a base-carrier film, from which the liner film is exfoliated; and exfoliating the carrier film from the base-carrier film attached to the OLED panel.

According to another embodiment of the present disclosure, there is provided an organic light-emitting display apparatus including a base film and an OLED panel, wherein the OLED panel includes a substrate and an organic light-emitting device on the substrate, wherein the base film includes a base film and an adhesive layer arranged on an upper surface of the base material, and the base film has a transmittivity of 85 to 98% and a haze of 0.2 to 1.0%.

Also, the adhesive layer may include an antistatic agent.

Also, at least one surface of the base material may be antistatic treated.

Also, the adhesive layer may have a thickness of 10 to 30 μm, and the base material has a thickness of 65 to 140 μm.

Also, adhesion of the adhesive layer measured by using a measurement method below may be 250 gf/in or higher:
[Measurement Method]
The adhesive layer was adhered to glass, and after 24 hours, an adhesion of the adhesive layer was measured when the adhesive layer was exfoliated at 180° at a rate of 5 mm per second.

Also, the adhesive layer may be formed of a first adhesive composition, and the adhesive composition may include a first main agent resin and a pyridine antistatic agent, wherein the pyridine antistatic agent is included in an amount of 0.5 to 5 parts by weight based on 100 parts by weight of the first main agent resin.

MODE OF DISCLOSURE

Hereinafter, embodiments of the present disclosure will be described in detail with reference to the accompanying drawings, which will be readily apparent to those skilled in the art to which the present disclosure pertains. The present disclosure may be embodied in many different forms and should not be construed as limited to the embodiments set forth herein. In the drawings, portions unrelated to the description are omitted for clarity of the present disclosure, and like reference numerals refer to like elements throughout.

As illustrated in FIG. 1, a lower part protection film for an OLED panel, according to an embodiment of the present disclosure includes a base-carrier film 200 including a base film 120 including a first adhesive layer 121 formed on an upper surface of a first base material 122 and a carrier film 130 including a second adhesive layer 131 adhered to a lower surface of the first base material 122 and a second base material 132 adhered to a lower surface of the second adhesive layer 131, and a liner film 110 adhered using (adhered to and using) the first adhesive layer 121.

Before describing each layer constituting the lower part protection film for an OLED panel, according to the present disclosure, as illustrated in FIG. 1, the reason why the lower part protection film for an OLED panel according to the present disclosure, and the liner film 110 and the base-carrier film 200 included therein have to satisfy Condition (1) and Condition (2) below will be described first.

When attaching a protection film to the bottom of an OLED panel, and when a reflectance thereof is low and a recognition rate of an alignment process is low, it is impossible to accurately attach a protection film to the OLED panel, and thus errors may be caused. If the protection film is repeatedly exfoliated and attached whenever an error occurs, residue may be left in the OLED panel or the manufacturing costs and time may increase. Also, when exfoliating the protection film from the OLED panel when an error has occurred, if a recognition rate of an alignment process is low, exfoliating the protection film may also be difficult. Thus, there is a need to increase the recognition rate of an alignment process.

Accordingly, when attaching a protection film to the bottom of an OLED panel, it is essential that the lower part protection film for an OLED panel has an appropriate reflectance. The lower part protection film for an OLED panel according to the present disclosure satisfies both Condition (1) and Condition (2) below to show an appropriate reflectance and thus to improve a recognition rate of an alignment process.

Condition (1) may be that a reflectance of the lower part protection film for an OLED panel is 12 to 18%, preferably, 12 to 16%, at a wavelength of 400 to 700 nm, and Condition (2) may be that a reflectance ratio between a liner film and a base-carrier film is 1:0.3 to 3.0, preferably, 0.62 to 2.6.

When the reflectance of the lower part protection film for an OLED panel does not satisfy 12 to 18% at a wavelength of 400 to 700 nm in Condition (1), it may be difficult to exfoliate a liner film in an operation of attaching the lower part protection film for an OLED panel, to the bottom of an OLED panel, and this may increase a defect rate. Also, when the reflectance ratio between the liner film and the base-carrier film at a wavelength of 400 to 700 nm does not satisfy 1:0.3 to 3.0 in Condition (2), it may be impossible to accurately attach a protection film to an OLED panel in an operation of attaching a lower part protection film for an OLED panel, to the bottom of an OLED panel, and this may cause an error.

The lower part protection film for an OLED panel may satisfy Condition (3) below at a wavelength of 400 to 700 nm.

$$\frac{b+c}{a} \leq 1.0, \quad (3)$$

where a denotes a reflectance deviation (%) of the liner film, b denotes a reflectance deviation (%) of the base-carrier film, and c denotes a reflectance deviation (%) of the lower part protection film for an OLED panel.

A deviation in a reflectance according to wavelength refers to a variation in a reflectance according to a varying wavelength, and a small deviation means that an increase or decrease in the reflectance according to a variation in a wavelength is small, meaning that a constant recognition rate of an alignment process may be obtained. A large deviation means that an increase or decrease in the reflectance according to a variation in a wavelength may be large, and a reflectance may be excessively low at a certain wavelength, and a recognition rate of an alignment process may be poor accordingly.

In Condition (3), when $$\frac{b+c}{a}$$

exceeds 1, a deviation in a reflectance of the base-carrier film and/or the lower part protection film for an OLED panel may be excessive according to a wavelength, thus frequently causing errors.

Also, as a wavelength increases, a reflectance of the lower part protection film for an OLED panel may be gradually reduced. In detail, from a short wavelength to a long wavelength, a reflectance of the lower part protection film for an OLED panel may be gradually reduced, but is not limited thereto.

Meanwhile, a total haze of the lower part protection film for an OLED panel may be 5 to 10%, preferably, 5.5 to 9.5%. When a haze of the lower part protection film for an OLED panel deviates from the above ranges, it may be difficult to exfoliate a liner film in an operation of attaching the lower part protection film for an OLED panel, to the bottom of an OLED panel, and a defect rate may increase accordingly.

Hereinafter, components included in the lower part protection film for an OLED panel will be described in detail.

First, the liner film 110 will be described.

The liner film 110 has a function of protecting the base-carrier film 200. In a process of attaching a lower part protection film for an OLED panel according to the present disclosure, to an OLED panel, an alignment process may be performed, and in this case, the liner film 110 is first exfoliated, and then the base-carrier film 200 may be attached to the OLED panel.

Here, in an operation of exfoliating the liner film 110, in order to prevent exfoliation between the base film 120 and the carrier film 130, a releasing force of the liner film 110 may be relatively small compared to an exfoliation force between the base film 120 and the carrier film 130, and a releasing force of the liner film 110 may preferably be 5 gf/in or less, more preferably, 2 to 4 gf/in. When the releasing force of the liner film 110 exceeds 5 gf/in, and when exfoliating the liner film 110 from the base-carrier film 200, exfoliation between the base film 120 and the carrier film 130 may be generated, and this may significantly increase a defect rate.

Figure 2:
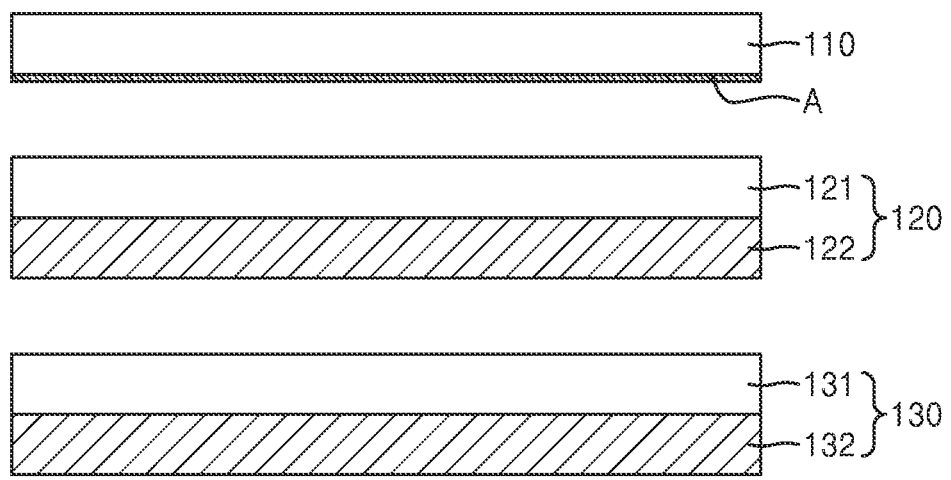
FIG. 2 is a disassembled cross-sectional view of a lower part protection film for an OLED panel, according to an embodiment of the present disclosure.

As illustrated in FIG. 2, in order for the liner film 110 to exhibit a releasing force as described above, a lower surface of the liner film 110 may be release-treated (A). In the release treatment above, any material that is typically used in release treatment may be used without limitation, and preferably, release treatment may preferably be performed using silicon to obtain an appropriate level of releasing force.

Meanwhile, as the lower surface of the liner film 110 is release-treated (A), the liner film 110 may satisfy both Conditions (4) and (5) below.

(4) reflectance at a wavelength of 520 nm>reflectance at a wavelength of 440 nm; and (5) reflectance at a wavelength of 520 nm>reflectance at a wavelength of 690 nm.

As Conditions (4) and (5) are both satisfied, an appropriate reflectance for an alignment process may be obtained, thus increasing a recognition rate of the alignment process. When Conditions (4) and (5) are not met, in an operation of identifying removal after exfoliating the liner film, an error may occur, that an operation of attaching a protection film, from which a liner is not removed, to a panel, may be performed, increasing a defect rate.

In addition, the liner film 110 may have a reflectance of 5 to 13%, preferably, 6 to 12%, at a wavelength of 400 to 700 nm, to satisfy both Condition (1) and Condition (2). When the reflectance of the liner film 110 at a wavelength of 400 to 700 nm does not satisfy the above ranges, a recognition rate of an alignment process may be degraded, and occurrence of errors and a defect rate may be increased as a result.

Meanwhile, to prevent generation of static electricity, at least one surface of the liner film 110 according to the present disclosure, preferably an upper surface and a lower surface thereof, may be antistatic treated. Through antistatic treatment, generation of static electricity may be prevented, and a difference in refractive indices with respect to the base-carrier film may be reduced, thus further improving a recognition rate of an alignment process.

Any material that is typically used in a liner film in the art may be used as the liner film 110 without limitation, and preferably, a PET base material may be used. Also, a thickness of the liner film 110 is not limited as long as the thickness is a thickness of a liner film that may be typically used in a protection film, and may preferably be 55 to 95 µm, more preferably 60 to 90 µm, but is not limited thereto.

Next, the base-carrier film 200 will be described.

The base-carrier film 200 includes a base film 120 including a first adhesive layer 121 formed on an upper surface of a first base material 122 and a carrier film 130 including a second adhesive layer 131 adhered to a lower surface of the first base material 122 and a second base material 132 adhered to a lower surface of the second adhesive layer 131.

First, the carrier film 130 has a function of protecting the bottom of the base film 120 that is directly attached to an OLED panel. In a process of attaching a lower part protection film for an OLED panel according to the present disclosure, to an OLED panel, an alignment process may be performed, and in this case, the liner film 110 is first exfoliated, and then the base-carrier film 200 may be attached to the OLED panel, and then the carrier film 130 may be exfoliated from the base-carrier film 200.

In an operation of exfoliating the carrier film 130 from the base-carrier film 200, in order to prevent exfoliation between the OLED panel and the base film 120, an exfoliation force between the base film 120 and the carrier film 130 may be relatively sufficiently small compared to an adhesion of the first adhesive layer 121 of the base film 120, and preferably, an exfoliation force between the base film 120 and the carrier film 130 may be 3 to 10 gf/in, more preferably, 4 to 9 gf/in. When the exfoliation force between the base film 120 and the carrier film 130 does not satisfy the above ranges, in an operation of exfoliating the liner film 110, exfoliation between the base film 120 and the carrier film 130 may occur, and exfoliation between the OLED panel and the base film 120 may occur in an operation of exfoliating the carrier film 130 from the base film 120.

Meanwhile, to prevent generation of static electricity, at least one surface of the second base material 132 included in the carrier film 130 according to the present disclosure, preferably a lower surface thereof, may be antistatic treated. Through antistatic treatment, generation of static electricity may be prevented, and a reflectance may be improved by reducing a difference in refractive indices with respect to the second adhesive layer 131 and the base film 120.

As the second base material 132, any material that may be typically used in a protection film in the art may be used without limitation, and preferably, a PET base material may be used. Also, a thickness of the second base material 132 is not limited as long as the thickness is a thickness of a base material that may be typically used in a protection film, and may be preferably 20 to 60 µm, more preferably, 25 to 55 µm.

As the second adhesive layer 131 included in the carrier film 130, any material for typically forming an adhesive layer in the art may be used without limitation, and the second adhesive layer 131 may preferably be an acrylic adhesive layer. In addition, a thickness of the second adhesive layer 131 is not limited as long as the thickness is a thickness of an adhesive layer typically included in a protection film, and may preferably be 1 to 10 µm, more preferably, 2 to 9 µm.

The second adhesive layer 131 included in the carrier film 130 according to the present disclosure may include an antistatic agent to prevent generation of static electricity. By including the antistatic agent, generation of static electricity may be prevented, and a reflectance may be improved by reducing a difference in refractive indices with respect to the second base material 132 and the base film 120.

Detailed description of the second adhesive layer 131 will be provided with reference to a manufacturing method which will be described later.

Next, the base film 120 is directly attached to an OLED panel and has a function of protecting the bottom of the OLED panel. In a process of attaching a lower part protection film for an OLED panel according to the present disclosure, to an OLED panel, an alignment process may be performed, and in this case, the liner film 110 is first exfoliated, and then the base-carrier film 200 may be attached to the OLED panel, and then the carrier film 130 may be exfoliated from the base-carrier film 200 to locate a protection film on the bottom of the OLED panel.

Here, to prevent exfoliation of the protection film formed on the bottom of the OLED panel, an adhesion of the base film 120 has to be sufficiently large, and preferably, an adhesion of a first adhesive layer measured using a measurement method below may be 250 gf/in or higher, more preferably, the adhesion may be 1000 to 2300 gf/in.

[Measurement Method]

The first adhesive layer was adhered to glass, and after 24 hours, adhesion of the first adhesive layer was measured when the first adhesive layer was exfoliated at 180° at a rate of 5 mm per second.

When the adhesion of the base film 120 measured using the measurement method is less than 250 gf/in, the base film 120 may be exfoliated from the OLED panel.

Meanwhile, to prevent generation of static electricity, at least one surface of the first base material 122 included in the base film 120 according to the present disclosure, preferably a lower surface thereof, may be antistatic treated. Through antistatic treatment, generation of static electricity may be prevented, and a reflectance may be improved by reducing a difference in refractive indices with respect to the first adhesive layer 121 and the carrier film 130.

Any material that is typically used in a protection film in the art may be used as the first base materials 122 without limitation, and preferably, a PET base material may be used. In addition, a thickness of the first base material 122 is not limited as long as the thickness may be typically used in a protection film, and may preferably be 65 to 140 µm, more preferably, 70 to 130 µm.

As the first adhesive layer 121 included in the base film 120, any material for typically forming an adhesive layer in the art may be used without limitation, and the first adhesive layer 121 may preferably be an acrylic adhesive layer. In addition, a thickness of the first adhesive layer 121 is not limited as long as the thickness is a thickness of an adhesive layer typically included in a protection film, and may preferably be 10 to 30 µm, more preferably, 12 to 26 µm.

The first adhesive layer 121 included in the base film 120 according to the present disclosure may include an antistatic agent to prevent generation of static electricity. By including the antistatic agent, generation of static electricity may be prevented, and a reflectance may be improved by reducing a difference in refractive indices with respect to the first base material 122 and the carrier film 130.

Detailed description of the first adhesive layer 121 will be provided with reference to a manufacturing method which will be described later.

The base film 120 may have a transmittivity of 85 to 98%, preferably, a transmittivity of 88 to 97%, and a haze of 0.2 to 1.0%, preferably, a haze of 0.3 to 0.9%. When the base film 120 does not satisfy the above transmittivity range and the above haze range, it may be difficult to realize a targeted reflectance, and also, an inspection capability regarding a defect on the appearance of a product during a product inspection process may be degraded, thereby allowing defects to pass undetected.

Also, in order to satisfy both Condition (1) and Condition (2), the base-carrier film 200 may have a reflectance of 8 to 13%, preferably, 9 to 12% at a wavelength of 400 to 700 nm. At a wavelength of 400 to 700 nm, when a reflectance of the base-carrier film 200 is less than 8%, a recognition rate of an alignment process are degraded, and thus, errors and a defect rate are increased accordingly. In detail, as the recognition rate of the alignment process are degraded, when the base-carrier film 200 to be attached to the bottom of the OLED panel is incorrectly attached, then the OLED panel and the base-carrier film 200 have to be exfoliated again and attachment is to be re-performed, and as the process is repeated, there may be residue under the OLED panel, and this may increase a defect rate. Also, when the reflectance exceeds 13%, the recognition rate of the alignment process may be degraded, and thus, errors and a defect rate may be increased.

Meanwhile, the reflectance at a wavelength of 400 to 700 nm specified in the present disclosure refers to not only a reflectance at a certain wavelength, but an appropriate reflectance at most wavelengths in a visible ray range, and thus, it means that a recognition rate of an alignment process may be high at most wavelengths in the visible ray range regardless of any particular wavelength.

The lower part protection film for an OLED panel described above may be manufactured by using a manufacturing method which will be described later, but is not limited thereto.

The lower part protection film for an OLED panel according to the present disclosure may be manufactured using a method including: manufacturing a base film 120 by forming a first adhesive layer 121 by coating and curing a first adhesive composition including a first main agent resin, on an upper surface of a first base material 122; manufacturing a carrier film 130 by forming a second adhesive layer 131 by coating and curing a second adhesive composition including a second main agent resin, on an upper surface of a second base material 132; manufacturing a base-carrier film 200 by laminating the base film 120 on an upper surface of the carrier film 130; and laminating the liner film 110 on the base-carrier film 200 to manufacture a lower part protection film for an OLED panel.

First, an operation of manufacturing the base film 120 by forming the first adhesive layer 121 by coating and curing a first adhesive composition including a first main agent resin, on an upper surface of the first base material 122 will be described.

The first adhesive composition may include a first main agent resin, and may further include a first curing agent, a solvent, and an antistatic agent.

The first main agent resin may be any resin that may be typically used for forming an adhesive layer having a sufficient adhesion, without limitation, and may preferably be an acrylic resin, and more preferably, polybutyl methacrylate, more preferably, polybutyl methacrylate having a weight average molecular weight of 200,000 to 1,000,000, and most preferably, polybutyl methacrylate having a weight average molecular weight of 400,000 to 800,000.

Also, the first curing agent may be any curing agent that may be used in forming an adhesive layer exhibiting typically sufficient adhesion, without limitation, and preferably, an epoxy curing agent may be used, and more preferably, an epoxy amine curing agent, and even more preferably, N,N, N,N'-tetraglycidyl-m-xylylenediamine may be used. The first curing agent may be included in an amount of 0.02 to 0.08 parts by weight, preferably, 0.03 to 0.07 parts by weight, based on 100 parts by weight of the first main agent resin. When the content of the first curing agent is less than 0.02 parts by weight based on 100 parts by weight of the first main agent resin, the first adhesive layer may not be cured to a target level, and when the content of the first curing agent exceeds 0.08 parts by weight, the first adhesive layer may be excessively cured to lower the adhesion.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 35 to 55 parts by weight, preferably 40 to 50 parts by weight, based on 100 parts by weight of the first main agent resin.

The antistatic agent may be any material as long as it prevents static electricity, and preferably, using a pyridine antistatic agent may be useful in preventing static electricity and reducing a difference in refractive indices between layers to improve reflectance. The antistatic agent may be included at an amount of 0.5 to 5 parts by weight, preferably, 1 to 4 parts by weight, based on 100 parts by weight of the first main agent resin. When the antistatic agent does not satisfy the above ranges, targeted antistatic effects may not be obtained, and a difference in refractive indices between layers may be increased, and thus, a reflectance may be decreased and a recognition rate of an alignment process may be poor.

The base film 120 may be manufactured by forming the first adhesive layer 121 by coating and curing the first adhesive composition described above on the upper surface of the first base material 122 having a lower surface that is antistatic treated.

Next, an operation of manufacturing the carrier film 130 by forming the second adhesive layer 131 by coating and curing a second adhesive composition including a second main agent resin, on an upper surface of the second base material 132 will be described.

The second adhesive composition may include a second main agent resin, and may further include a second curing agent, a solvent, and an antistatic agent.

The second main agent resin may be any resin that may be typically used for forming an adhesive layer having a relatively small adhesion compared with the first adhesive layer, without limitation, and may preferably be an acrylic resin, and more preferably, polymethyl methacrylate, even more preferably, polymethyl methacrylate having a weight average molecular weight of 5,000 to 170,000, and most preferably, polymethyl methacrylate having a weight average molecular weight of 50,000 to 150,000.

Also, the second curing agent may be any curing agent that may be used for forming an adhesive layer that exhibits a relatively low adhesion compared with the first adhesive layer, without limitation, and preferably, an isocyanate curing agent may be used. The second curing agent may be included in an amount of 2 to 8 parts by weight, preferably, 3 to 7 parts by weight, based on 100 parts by weight of the second main agent resin. When the content of the second curing agent is less than 2 parts by weight based on 100 parts by weight of the second main agent resin, the second adhesive layer may not be cured to a target level, and when the content of the second curing agent exceeds 8 parts by weight, the second adhesive layer may be excessively cured to lower the adhesion.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 60 to 80 parts by weight, preferably 65 to 75 parts by weight, based on 100 parts by weight of the second main agent resin.

Also, the antistatic agent may be any material as long as it prevents static electricity, and preferably, using a pyridine antistatic agent may be useful in preventing static electricity and reducing a difference in refractive indices between layers to improve reflectance. The antistatic agent may be included at an amount of 0.1 to 0.4 parts by weight, preferably, 0.15 to 0.35 parts by weight, based on 100 parts by weight of the second main agent resin. When the antistatic agent does not satisfy the above ranges, targeted antistatic effects may not be obtained and a difference in refractive indices between layers may be increased, and thus, a reflectance may be decreased and a recognition rate of an alignment process may be poor.

Meanwhile, the second adhesive composition may further include a leveling agent and a wetting agent. The leveling agent and the wetting agent may be any material, without limitation, as long as they are typically used in forming an adhesive layer in the art. Preferably, the leveling agent may be polyacrylate, and the wetting agent may be polyether siloxane, but they are not limited thereto. In addition, the leveling agent may be included in an amount of 0.25 to 2.25 parts by weight, preferably, 0.5 to 2 parts by weight, based on 100 parts by weight of the second main agent resin, and the wetting agent may be included in an amount of 0.2 to 0.8 parts by weight, preferably, 0.3 to 0.7 parts by weight, based on 100 parts by weight of the second main agent resin, but they are not limited thereto.

The carrier film 130 may be manufactured by forming the second adhesive layer 131 by coating and curing the second adhesive composition described above on the upper surface of the second base material 132 having a lower surface that is antistatic treated.

Next, an operation of laminating the base film 120 on an upper surface of the carrier film 130 to manufacture the base-carrier film 200 and an operation of laminating the liner film 110 on the base-carrier film 200 to manufacture a lower part protection film for an OLED panel will be described.

The base film 120 and the liner film 110 may be laminated using any method and/or under any conditions that are typically used in the art. Lamination may be performed preferably by using a roll laminator at room temperature, but is not limited thereto.

Also, the base-carrier film 200 may be laminated using any method and/or under any conditions for typically laminating the base film 120 and the carrier film 130 in the art, and preferably, lamination may be performed at room temperature by using a roll laminator to manufacture a lower part protection film for an OLED panel, but is not limited thereto.

According to the present disclosure, a method of applying a lower part protection film for an OLED panel according to the present disclosure, to an OLED panel, is provided; in detail, a method of applying a lower part protection film for an OLED panel is provided, the method including: exfoliating a liner film from the lower part protection film for an OLED panel described above; attaching a base-carrier film, from which the liner film is exfoliated, to an OLED panel; and exfoliating the carrier film from the base-carrier film attached to the OLED panel.

First, a first alignment process may be performed to exfoliate the liner film from the lower part protection film for an OLED panel, and the liner film may be exfoliated from the lower part protection film for an OLED panel by irradiating light of a wavelength of 400 to 700 nm and sensing reflected light. Here, when the liner film does not show an appropriate level of reflectance, an error may occur, and the process time and/or costs may increase, and a defect rate may be increased.

Next, a second alignment process may be performed to attach, to the OLED panel, the base-carrier film, from which the liner film is exfoliated, and the base-carrier film may be attached to the OLED panel by irradiating light of a wavelength of 400 to 700 nm and sensing the reflected light. Here, when the base-carrier film does not show an appropriate level of reflectance, it may be difficult to accurately attach a base-carrier film to the OLED panel, and thus an error may be caused. If a protection film is repeatedly exfoliated and attached whenever an error occurs, residue may be left in the OLED panel or the manufacturing costs and time may increase.

Next, a third alignment process may be performed to exfoliate the carrier film from the base-carrier film attached to the OLED panel, and the carrier film may be exfoliated from the base-carrier film attached to the OLED panel by irradiating light of a wavelength of 400 to 700 nm and sensing reflected light. Here, when the base-carrier film does not show an appropriate level of reflectance, an error may occur, and thus, the processing time and/or costs may increase, and a defect rate may be increased.

Meanwhile, the present disclosure includes an organic light-emitting display apparatus 10 implemented by including the above-described base film.

Figure 3:
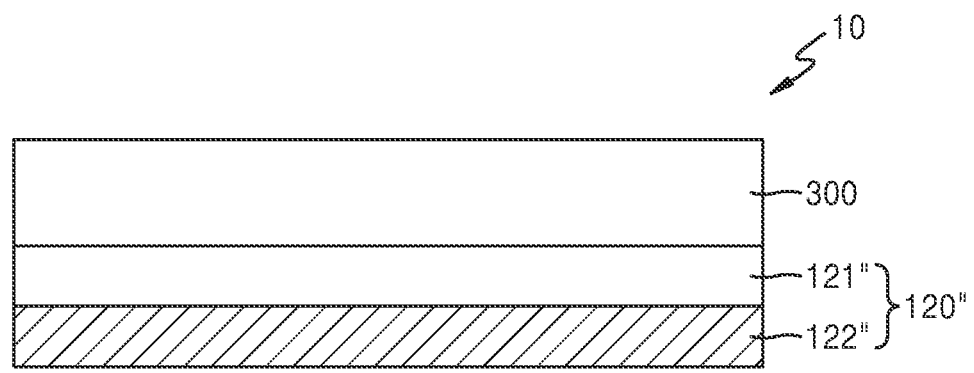
FIG. 3 is a cross-sectional view of an organic light-emitting display apparatus according to an embodiment of the present disclosure.

As shown in FIG. 3, the organic light-emitting display apparatus 10 may include the base film 120" attached to the bottom of an OLED panel 300. Here, the OLED panel 300 includes a substrate and an organic light-emitting device arranged on the substrate. The organic light-emitting device may be provided by stacking a first electrode, an intermediate layer including an organic emitting layer, and a second electrode. The base film 120" may be attached to the bottom of the substrate of the OLED panel 300. In detail, as the base film 120" including a first adhesive layer 121" having a sufficient adhesion and a first base material 122" having a function of protecting the OLED panel 300 is included, the bottom of the OLED panel 300 may be protected, and generation of static electricity of the OLED panel 300 may be prevented.

Meanwhile, as the lower part protection film for an OLED panel according to the present disclosure has a high reflectance, a recognition rate of an alignment process may be significantly improved, and also, generation of static electricity may be prevented through an antistatic treatment, and an excellent adhesion to an OLED panel may be provided at the same time.

The present disclosure will be described in more detail with reference to embodiments thereof below but the scope of the present disclosure is not limited by the embodiments, which should be interpreted as being provided to help to understand the present disclosure.

Example 1

(1) Manufacture of Base Film and Liner Film Lamination

A first adhesive composition was prepared by mixing polybutyl methacrylate (BURIM CHEMICAL, BA8900) having a weight average molecular weight of 600,000 as a first main agent resin, 0.05 parts by weight of N,N,N',N'-tetraglycidyl-m-xylenediamine (BURIM CHEMICAL, 45S) as a first curing agent, 2.5 parts by weight of a pyridine antistatic agent (KOEI, IL-P14-2) as an antistatic agent, and 45 parts by weight of methyl ethyl ketone (MEK) as a solvent, based on 100 parts by weight of the first main agent resin.

A base film was manufactured by coating the first adhesive composition on an upper surface of the first base material that is antistatic-treated by coating a thin film of PEDOT/PSS (poly (3,4-ethylenedioxythiophene) polystyrene sulfonate) on a lower surface of a PET base material having a thickness of 75 μm, and an upper surface and the lower surface of the PET base material having a thickness of 75 μm were coated with a thin film of PEDOT/PSS (poly (3,4-ethylenedioxythiophene) polystyrene sulfonate) to antistatic-treat the PET base material, and a thin film of a silicon releasing agent was coated on a lower surface of a liner film to silicon release-treat the liner film, and then the liner film was laminated using a roll laminator at room temperature and cured at 50° C. for 48 hours to manufacture the base film including the first adhesive layer having a thickness of 13 μm and the liner film stacked on the base film.

(2) Manufacture of Carrier Film

A second adhesive composition was prepared by mixing polymethyl methacrylate (SUSAN POLYMER Co., Ltd., SA609) having a weight average molecular weight of 100,000 as a second main agent resin, 5 parts by weight of polyisocyanate (SUSAN POLYMER Co., Ltd., SAX802) as a second curing agent, 0.25 parts by weight of a pyridine antistatic agent (KOEI, IL-P14-2) as an antistatic agent, 1.25 parts by weight of polyacrylate (BYK, BYK361N) as a leveling agent, polyether siloxane (TEGO, WET270) as a wetting agent, and 70 parts by weight of methyl ethyl ketone (MEK) as a solvent, based on 100 parts by weight of the second main agent resin.

The second adhesive composition was coated on the upper surface of the second base material that is antistatic-treated by coating a thin film of PEDOT/PSS (poly (3,4-ethylenedioxythiophene) polystyrene sulfonate) on a lower surface of a PET base material having a thickness of 38 μm, and cured at 50° C. for 48 hours to prepare a carrier film including a second adhesive layer having a thickness of 5 μm.

(3) Manufacture of OLED Lower Part Protection Film

The base film and the carrier film that are laminated with the liner film were laminated at 25° C. by using a roll laminator to manufacture an OLED lower part protection film.

Examples 2 Through 9 and Comparative Examples 1 Through 8

An OLED panel lower part protection film, as shown in Tables 1 through 3, was manufactured in the same manner as Example 1 except by modifying conditions such as the content of the antistatic agent in the first adhesive composition and the second adhesive composition, whether to perform antistatic treatment on the first base material, the second base material, and the liner film, or the like as shown in Tables 1 through 3.

Experimental Example 1

1. Measurement of Reflectance

Regarding the lower part protection film for an OLED panel, manufactured according to Examples and Comparative Examples, a reflectance of the liner film, a reflectance of the base-carrier film, and a reflectance of the lower part protection film for an OLED panel were measured. In detail, by using a reflectance measurement mode of a spectrophotometer (Konica Minolta, CM3700A), an average of each of the reflectance of the liner film, the reflectance of the base-carrier film, and the reflectance of the lower part protection film for an OLED panel was measured at a wavelength of 400 nm to 700 nm, and listed in Tables 1 through 3.

2. Evaluation of Errors in Alignment Process

Errors in three alignment processes of aligning the lower part protection film for an OLED panel, manufactured according to each of Examples and Comparative Examples, with an OLED panel, were evaluated as below, and listed in Tables 1 through 3.

2-(1) Evaluation of Errors in First Alignment Process

In a process of aligning the lower part protection film for an OLED panel, manufactured according to each of Examples and Comparative Examples, with an OLED panel, errors in the first alignment process were evaluated by marking—○ when the liner film was exfoliated by performing the exfoliation once and by marking—× when the liner film was exfoliated by performing the exfoliation twice or more in the operation of exfoliating the liner film from the lower part protection film for an OLED panel. This evaluation was performed 100 times and a ratio of errors during the 100 times is shown in Tables 1 through 3.

2-(2) Evaluation of Errors in Second Alignment Process

In a process of aligning the lower part protection film for an OLED panel, manufactured according to each of Examples and Comparative Examples, with an OLED panel, errors in the second alignment process were evaluated by marking—○ when an area deviating from the OLED panel, which is a surface to which an object is to be attached, is 0.1% or less of the total area of the base-carrier film and by marking—× when an area deviating from the OLED panel, which is a surface to which an object is to be attached, exceeds 0.1% of the total area of the base-carrier film in the operation of attaching the base-carrier film, from which the liner film is exfoliated. This evaluation was performed 100 times and a ratio of errors during the 100 times is shown in Tables 1 through 3.

2-(3) Evaluation of Errors in Third Alignment Process

In a process of aligning the lower part protection film for an OLED panel, manufactured according to each of Examples and Comparative Examples, with an OLED panel, errors in the third alignment process were evaluated by marking—○ when the carrier film was exfoliated from the attached base-carrier film by performing the exfoliation once and by marking—× when the carrier film was exfoliated by performing the exfoliation twice or more in the operation of exfoliating the carrier film from the attached base-carrier film. This evaluation was performed 100 times and a ratio of errors during the 100 times is shown in Tables 1 through 3.

TABLE 1

| | Division | Example 1 | Example 2 | Example 3 | Example 4 | Example 5 |
|---|---|---|---|---|---|---|
| first adhesive composition | content of antistatic agent (part by weight) | 2.5 | 1 | 4 | 2.5 | 2.5 |
| second adhesive composition | content of antistatic agent (part by weight) | 0.25 | 0.25 | 0.25 | 0.15 | 0.35 |
| whether antistatic treatment is performed | lower surface of first base material | ○ | ○ | ○ | ○ | ○ |
| | lower surface of second base material | ○ | ○ | ○ | ○ | ○ |
| | upper surface of liner film | ○ | ○ | ○ | ○ | ○ |
| | lower surface of liner film | ○ | ○ | ○ | ○ | ○ |
| reflectance | liner film(%) | 8.2 | 8.2 | 8.2 | 8.2 | 8.2 |
| | base-carrier film(%) | 10.1 | 11.8 | 9.3 | 11.2 | 9.6 |
| | reflectance ratio of liner/ base-carrier | 1:1.23 | 1:1.44 | 1:1.13 | 1:1.37 | 1:1.17 |
| | lower part protection film for OLED panel (%) | 12.9 | 15.3 | 12.1 | 14.9 | 12.3 |
| evaluation of errors in alignment process | first alignment(%) | 1 | 1 | 1 | 1 | 1 |
| | second alignment(%) | 0 | 0 | 2 | 0 | 1 |
| | third alignment(%) | 0 | 0 | 1 | 0 | 1 |

TABLE 2

| | Division | Example 6 | Example 7 | Example 8 | Example 9 | Comparative Example 1 | Comparative Example 2 |
|---|---|---|---|---|---|---|---|
| first adhesive composition | content of antistatic agent (part by weight) | 2.5 | 2.5 | 2.5 | 2.5 | 0.1 | 7 |
| second adhesive composition | content of antistatic agent (part by weight) | 0.25 | 0.25 | 0.25 | 0.25 | 0.25 | 0.25 |
| whether antistatic treatment is performed | lower surface of first base material | × | ○ | ○ | ○ | ○ | ○ |
| | lower surface of second base material | ○ | × | ○ | ○ | ○ | ○ |
| | upper surface of liner film | ○ | ○ | × | ○ | ○ | ○ |
| | lower surface of liner film | ○ | ○ | ○ | × | ○ | ○ |
| reflectance | liner film(%) | 8.2 | 8.2 | 3.8 | 4.1 | 8.2 | 8.2 |
| | base-carrier film(%) | 5.4 | 5.8 | 10.1 | 10.1 | 14.1 | 6.8 |
| | reflectance ratio of liner/base-carrier | 1:0.66 | 1:0.71 | 1:2.65 | 1:2.46 | 1:1.72 | 1:0.83 |

TABLE 2-continued

| Division | | Example 6 | Example 7 | Example 8 | Example 9 | Comparative Example 1 | Comparative Example 2 |
|---|---|---|---|---|---|---|---|
| | lower part protection film for OLED panel (%) | 11.3 | 11.6 | 11.6 | 11.8 | 18.1 | 11.7 |
| evaluation of errors in alignment process | first alignment (%) | 1 | 1 | 8 | 9 | 1 | 1 |
| | second alignment (%) | 8 | 7 | 0 | 0 | 5 | 9 |
| | third alignment (%) | 6 | 6 | 0 | 0 | 7 | 8 |

TABLE 3

| Division | | Comparative Example 3 | Comparative Example 4 | Comparative Example 5 | Comparative Example 6 | Comparative Example 7 | Comparative Example 8 |
|---|---|---|---|---|---|---|---|
| first adhesive composition | content of antistatic agent (part by weight) | 2.5 | 2.5 | 2.5 | 2.5 | 1 | 4 |
| second adhesive composition | content of antistatic agent (part by weight) | 0.03 | 1 | 0.25 | 0.25 | 0.15 | 0.35 |
| whether antistatic treatment is performed | lower surface of first base material | ○ | ○ | ○ | X | ○ | ○ |
| | lower surface of second base material | ○ | ○ | ○ | X | ○ | ○ |
| | upper surface of liner film | ○ | ○ | X | ○ | ○ | ○ |
| | lower surface of liner film | ○ | ○ | X | ○ | ○ | ○ |
| reflectance | liner film(%) | 8.2 | 8.2 | 4.0 | 8.2 | 8.2 | 8.2 |
| | base-carrier film(%) | 13.7 | 6.9 | 10.1 | 2.4 | 19.8 | 5.1 |
| | reflectance ratio of liner/base-carrier | 1:1.67 | 1:0.84 | 1:2.53 | 1:0.29 | 1:2.41 | 1:0.62 |
| | lower part protection film for OLED panel (%) | 17.9 | 11.8 | 11.6 | 9.9 | 22.1 | 10.9 |
| evaluation of errors in alignment process | first alignment (%) | 1 | 1 | 12 | 1 | 1 | 1 |
| | second alignment (%) | 6 | 7 | 0 | 15 | 10 | 9 |
| | third alignment (%) | 7 | 10 | 0 | 16 | 9 | 7 |

As shown in Tables 1 through 3,

Examples 1 through 5 that satisfy the preferable conditions according to the present disclosure, which are related to the content of the antistatic agent and whether relevant layers are antistatic treated, showed significantly less errors in an alignment process compared to Examples 6 through 9 and Comparative Examples 1 through 8 where at least one of the above conditions was omitted.

In detail, Example 1 in which the lower surface of the first base material was antistatic treated showed fewer errors in an alignment process compared to Example 6 in which the lower surface of the first base material was not antistatic treated. Also, Example 1 in which the lower surface of the second base material was antistatic treated showed fewer errors in an alignment process compared to Example 7 in which the lower surface of the second base material was not antistatic treated.

Also, Example 1 in which the upper and lower surfaces of the liner film were antistatic treated showed fewer errors in an alignment process compared to Example 8 in which the upper surface of the liner film was not antistatic treated and Example 9 in which the lower surface of the liner film was not antistatic treated.

In addition, each of Examples 1 through 3 in which the content of the antistatic agent included in the first adhesive composition is within a preferable range according to the present disclosure showed significantly fewer errors in an alignment process compared to Comparative Examples 1 and 2 which did not meet the condition of the content of the antistatic agent.

In addition, in each of Examples 1, 4, and 5 in which the content of the antistatic agent included in the second adhesive composition is within a preferable range according to the present disclosure showed significantly fewer errors in an alignment process compared to Comparative Examples 3 and 4 which did not meet the condition of the content of the antistatic agent.

Also, Example 1 in which the upper and lower surfaces of the liner film were antistatic treated showed significantly fewer errors in an alignment process compared to Comparative Example 5 in which both the upper and lower surfaces of the liner film were not antistatic treated.

Also, Example 1 in which the lower surface of the first base material and the lower surface of the second base material were antistatic treated showed far fewer errors in an alignment process compared to Comparative Example 6 in which the lower surface of the first base material and the lower surface of the second base material were not antistatic treated.

Also, Example 1 which satisfies both Conditions (1) and (2) showed far fewer errors in an alignment process compared to Comparative Examples 7 and 8 which do not satisfy Condition (1).

Examples 10 Through 17

A lower part protection film for an OLED panel as shown in Tables 4 and 5 was manufactured in the same manner as Example 1 except for by modifying conditions such as the weight average molecular weight of the first main agent resin or the second main agent resin and whether or not to perform release treatment on the lower surface of the liner film as shown in Tables 4 and 5.

Experimental Example 2

1. Evaluation of Releasing Force, Adhesion, and Exfoliation Force

Regarding the lower part protection film for an OLED panel manufactured according to Examples 1 and 10 through 17, a 1 inch width of the lower part protection film for an OLED panel was cut and then the lower part protection film was exfoliated at a rate of 40 mm per second at 180° to measure a liner releasing force. A 1 inch width of the lower part protection film for an OLED panel was cut to remove the liner film. Then the lower part protection film was attached to glass having a cleaned surface, and exfoliated, after 24 hours, at a rate of 5 mm per second at 180° to measure an adhesion of the first adhesive layer. A 1 inch width of the base-carrier film was cut and the carrier film was exfoliated at a rate of 40 mm per second at 180° to measure an exfoliation force between the base film and the carrier film. The measurement result is shown in Tables 4 and 5.

2. Evaluation of Workability of Alignment Process

Workability of an operation of aligning the lower part protection film for an OLED panel, manufactured according to Examples 1 and 10 through 17, to an OLED panel, was evaluated.

In the first alignment process of exfoliating the liner film from the lower part protection film for an OLED panel, when exfoliating the liner film, workability of the first alignment process was evaluated by marking—○ when only the liner film was exfoliated and marking—× when exfoliation between the base film and the carrier film was generated. Also, workability of the carrier film removing operation (third alignment process) was evaluated by marking—○ when the carrier film was exfoliated by performing the exfoliation once and by marking—× when the carrier film was exfoliated by performing the exfoliation twice or more in the operation of exfoliating the carrier film from the base-carrier film attached to the OLED panel. The evaluation result is shown in Tables 4 and 5 below.

3. Evaluation of Adhesive Performance of Lower Part Protection Film for OLED Panel The lower part protection film for an OLED panel manufactured according to each of Examples 1 and 10 through 17 was attached to an OLED panel at room temperature by using a roll laminator, and after 24 hours, the lower part protection film for an OLED panel was left at a temperature of 60° C. and a humidity of 90% and for 500 hours to identify whether the attached lower part protection film was exfoliated. The adhesive performance of the base film was evaluated by marking—○ when exfoliation did not occur and marking—× when exfoliation occurred. The evaluation result is shown in Tables 4 and 5.

TABLE 4

| Division | | Example 1 | Example 10 | Example 11 | Example 12 | Example 13 |
|---|---|---|---|---|---|---|
| whether lower surface of liner film is release-treated | | ○ | x | ○ | ○ | ○ |
| weight average molecular weight of first main agent resin | | 600,000 | 600,000 | 100,000 | 400,000 | 800,000 |
| weight average molecular weight of second main agent resin | | 100,000 | 100,000 | 100,000 | 100,000 | 100,000 |
| releasing force of liner film (gf/in) | | 3.2 | 9.8 | 3.2 | 3.2 | 3.2 |
| adhesion of first adhesive layer (gf/in) | | 1680 | 1680 | 207 | 1029 | 2263 |
| exfoliation force of base film/carrier film (gf/in) | | 6.6 | 6.6 | 6.6 | 6.6 | 6.6 |
| workability | first alignment | ○ | x | ○ | ○ | ○ |
| | third alignment | ○ | ○ | ○ | ○ | ○ |
| adhesive performance of base film | | ○ | ○ | x | ○ | ○ |

TABLE 5

| Division | Example 14 | Example 15 | Example 16 | Example 17 |
|---|---|---|---|---|
| whether lower surface of liner film is release-treated | ○ | ○ | ○ | ○ |
| weight average molecular weight of first main agent resin | 600,000 | 600,000 | 600,000 | 600,000 |
| weight average molecular weight of second main agent resin | 4,000 | 50,000 | 150,000 | 220,000 |
| releasing force of liner film (gf/in) | 3.2 | 3.2 | 3.2 | 3.2 |
| adhesion of first adhesive layer (gf/in) | 1680 | 1680 | 1680 | 1680 |
| exfoliation force of base film/carrier film (gf/in) | 1.3 | 4.1 | 8.8 | 12.2 |
| workability  first alignment | x | ○ | ○ | ○ |
| third alignment | ○ | ○ | ○ | x |
| adhesive performance of base film | ○ | ○ | ○ | ○ |

As shown in Tables 4 and 5,

Examples 1, 12, 13, 15, and 16 that each satisfy the conditions according to the present disclosure, which are related to the weight average molecular weight of the main agent resins and whether the lower surface of the liner film is release-treated, showed excellent workability in the first and third alignment processes and excellent adhesive performance of the base film compared to Examples 10, 11, 14, and 17 where at least one of the above conditions was omitted.

In detail, Example 1 in which the lower surface of the liner film was release-treated showed excellent workability in the first alignment process compared with Example 10 in which the lower surface of the liner film was not release-treated.

Also, Examples 1, 12, and 13 that each satisfy the preferable range of the weight average molecular weight of the first main agent resin according to the present disclosure showed excellent adhesive performance of the base film compared to Example 11 where the weight average molecular weight of the first main agent resin was not met.

In addition, Examples 1, 15, and 16 that each satisfy the preferable range of the weight average molecular weight of the second main agent resin according to the present disclosure showed excellent workability in the first alignment process compared to Example 14 where the above condition was not met, and showed excellent workability in the third alignment process compared to Example 17.

While the present disclosure has been particularly shown and described with reference to exemplary embodiments thereof, it is to be understood that the present disclosure is not limited to the disclosed exemplary embodiments. It will be understood by those skilled in the art that various changes such as addition, modification, elimination, or supplementation may be made therein to easily suggest other embodiments, without departing from the spirit and scope of the disclosure as defined by the appended claims.

What is claimed is:

1. An organic light-emitting display apparatus comprising a base film and an OLED panel,
    wherein the OLED panel comprises a substrate and an organic light-emitting device on the substrate,
    wherein the base film comprises a base material and an adhesive layer on an upper surface of the base material,
    the adhesive layer is formed from an adhesive composition comprising a resin mixed with an antistatic agent, and
    the base film has a transmittivity of 85 to 98% and a haze of 0.2 to 1.0%.

2. The organic light-emitting display apparatus of claim 1, wherein the adhesive layer comprises the antistatic agent.

3. The organic light-emitting display apparatus of claim 1, wherein at least one surface of the base material is antistatic treated.

4. The organic light-emitting display apparatus of claim 1, wherein the adhesive layer has a thickness of 10 to 30 μm, and the base material has a thickness of 65 to 140 μm.

5. An organic light-emitting display apparatus comprising a base film and an OLED panel,
    wherein the OLED panel comprises a substrate and an organic light-emitting device on the substrate,
    wherein the base film comprises a base material and an adhesive layer on an upper surface of the base material,
    the base film has a transmittivity of 85 to 98% and a haze of 0.2 to 1.0%, and
    an adhesion of the adhesive layer is 250 gf/in or higher, the adhesion is measured by utilizing a measurement method below:
    wherein in the measurement method, the adhesive layer was adhered to glass, and after 24 hours, the adhesion of the adhesive layer was measured when the adhesive layer was exfoliated at 180° at a rate of 5 mm per second.

6. An organic light-emitting display apparatus comprising a base film and an OLED panel,
    wherein the OLED panel comprises a substrate and an organic light-emitting device on an upper side of the substrate,
    wherein the base film is disposed under a lower side of the substrate, and
    wherein the base film comprises a base material and an adhesive layer on an upper surface of the base material, and
    the base film has a transmittivity of 85 to 98% and a haze of 0.2 to 1.0%.

7. The organic light-emitting display apparatus of claim 6, wherein the adhesive layer comprises an antistatic agent.

8. The organic light-emitting display apparatus of claim 6, wherein at least one surface of the base material is antistatic treated.

9. The organic light-emitting display apparatus of claim 6, wherein the adhesive layer has a thickness of 10 to 30 μm, and the base material has a thickness of 65 to 140 μm.

10. The organic light-emitting display apparatus of claim 6, wherein
    the adhesive layer is formed of a first adhesive composition, and
    the first adhesive composition comprises a first main agent resin and a pyridine antistatic agent, and
    the pyridine antistatic agent is included in an amount of 0.5 to 5 parts by weight based on 100 parts by weight of the first main agent resin.

* * * * *